US007015621B2

(12) United States Patent
Mizuuchi

(10) Patent No.: US 7,015,621 B2
(45) Date of Patent: Mar. 21, 2006

(54) PIEZOELECTRIC ACTUATOR DEVICE

(75) Inventor: Shigenobu Mizuuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 108 days.

(21) Appl. No.: 10/289,258

(22) Filed: Nov. 7, 2002

(65) Prior Publication Data

US 2003/0094882 A1    May 22, 2003

(30) Foreign Application Priority Data

Nov. 20, 2001  (JP)  ............................. 2001-355293

(51) Int. Cl.
*H01L 41/107*  (2006.01)
*H03B 5/30*  (2006.01)
(52) U.S. Cl. ................. 310/314; 310/316.01; 310/317; 310/318; 310/319; 331/116 R; 331/155
(58) Field of Classification Search ................ 310/314, 310/315, 316.01, 317–319; 331/116 R, 155, 331/156, 158, 160
See application file for complete search history.

(56) References Cited

U.S. PATENT DOCUMENTS 2,913,580 A * 11/1959 Kosowsky ................... 329/328
3,054,966 A * 9/1962 Etherington ................... 331/66
3,772,605 A * 11/1973 Otajima et al. .............. 329/328
5,955,819 A * 9/1999 Takano et al. .......... 310/316.01

FOREIGN PATENT DOCUMENTS

| JP | 63-204672 | 8/1988 |
| JP | 1-202178 | 8/1989 |
| JP | 9-327181 | 12/1997 |
| JP | 2836328 | 10/1998 |

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

The present invention relates to a piezoelectric actuator device that enables hysteresis of the amount of displacement in the piezoelectric actuator to be reduced, enables the system configuration to be simplified, and for which a high voltage need not be applied. A first circuit 1 comprises a piezoelectric actuator element 11 and a first resistor circuit 12, and the piezoelectric actuator element 11 and first resistor circuit 12 are connected in parallel. A second circuit 2 comprises a capacitor circuit 21 and a second resistor circuit 22, and the capacitor circuit 21 and second resistor circuit 22 are connected in parallel. The first circuit 1 and second circuit 2 are connected in series to form a series circuit, and both ends of that series circuit are led to a pair of input terminals T1 and T2.

14 Claims, 2 Drawing Sheets

PIEZOELECTRIC ACTUATOR DEVICE

BACKGROUND OF THE INVENTION

1. Field of the Invention

The present invention relates to a piezoelectric actuator device comprising a piezoelectric actuator element.

2. Description of the Related Art

Piezoelectric actuator elements are generally used for volume control, switches, or ink jet droplet control since they expand or contract when a voltage is applied to generate a displacement that is practically proportional to the applied voltage.

However, when a voltage is directly applied to such piezoelectric actuator element, the amount of displacement of the piezoelectric actuator element due to a process that is increasing the applied voltage differs significantly from the amount of displacement due to a process that is decreasing the applied voltage. In other words, a large hysteresis occurs in the amount of displacement of the piezoelectric actuator element. As a result, the amount of displacement of the piezoelectric actuator element for an applied voltage cannot be confirmed.

As a means of solving the abovementioned problem, Japanese Patent Publication No. 1997-327181A or Japanese Patent No. 2836328, for example, discloses a technique for detecting the amount of displacement of a piezoelectric actuator element and performing feedback control on the piezoelectric actuator element according to this detection signal. However, with this conventional technique, a feedback control circuit is required, making the system configuration more complex.

As another means of solving the abovementioned problem, Japanese Patent Publication No. 1988-20472A or Japanese Patent Publication No. 1989-202178A discloses a configuration in which a capacitor is connected in series with a piezoelectric actuator element. However, with this conventional technique, a voltage that is extremely higher, for example, several times to several tens of times higher than the normal applied voltage for a piezoelectric actuator element must be applied to the series circuit comprising the piezoelectric actuator element and capacitor. A special configuration is required to apply such a high voltage, which prevents the device from being made more compact.

SUMMARY OF THE INVENTION

An object of the present invention is to provide a piezoelectric actuator device that enables hysteresis of the amount of displacement in the piezoelectric actuator to be reduced.

A further object of the present invention is to provide a piezoelectric actuator device that enables the system configuration to be simplified.

A still further object of the present invention is to provide a piezoelectric actuator device for which a high voltage need not be applied.

To achieve the abovementioned objects, the piezoelectric actuator device of the present invention comprises a first circuit and a second circuit.

The first circuit comprises a piezoelectric actuator element and a first resistor circuit, and the piezoelectric actuator element and first resistor circuit are connected in parallel.

The second circuit comprises a capacitor circuit and a second resistor circuit, and the capacitor circuit and second resistor circuit are connected in parallel.

The first circuit and second circuit are connected in series to form a series circuit, and both ends of that series circuit are led to a pair of input terminals.

In the piezoelectric actuator device of the present invention described above, since the first circuit comprises a piezoelectric actuator element and a first resistance circuit, which the connected in parallel, an impedance Z1 is generated according to the capacitance Ca of the piezoelectric actuator element and resistance R1 of the first resistor circuit.

Similarly, since the second circuit comprises a capacitor circuit and a second resistance circuit, which are connected in parallel, an impedance Z2 is generated according to the capacitance C1 of the capacitor circuit and resistance R2 of the second resistor circuit.

These first and second circuits are connected in series to form a series circuit, and both ends of that series circuit are led to a pair of input terminals. Therefore, if a DC voltage (hereafter, referred to as an input DC voltage) is applied between the input terminals, the input DC voltage is divided according to the impedance ratio |Z1/Z2| of the first circuit to the second circuit, and so a voltage that depends on the input DC voltage is applied to the piezoelectric actuator element included in the first circuit. Therefore, by changing the input DC voltage between the input terminals, the voltage, which is applied to the piezoelectric actuator element, can be changed to control the amount of displacement of the piezoelectric actuator element.

When the input DC voltage is changed as described above, the voltage, which is applied to the piezoelectric actuator element, changes from a steady state, and a transient state occurs until that voltage is stabilized.

In the present invention, the capacitance Ca of the piezoelectric actuator element, resistance R1 of the first resistor circuit, capacitance C1 of the capacitor circuit, and resistance R2 of the second resistor circuit should be set to appropriate values. If this is done, they will be set so that the abovementioned impedance ratio |Z1/Z2| will be larger in the transient state, which includes a frequency component, than in the steady state, which includes almost no frequency component. Therefore, when the input DC voltage is changed while controlling the amount of displacement of the piezoelectric actuator element, a larger voltage than the steady-state applied voltage is temporarily applied to the first circuit, and so a voltage that exceeds the required voltage is temporarily applied to the piezoelectric actuator element. As a result, the hysteresis in the amount of displacement of the piezoelectric actuator element is reduced.

Also, according to the present invention, the amount of displacement of the piezoelectric actuator element can be controlled without establishing a feedback control circuit, and so the system configuration is simplified.

Moreover, according to the present invention, the amount of displacement of the piezoelectric actuator element can be controlled without applying a high voltage. Therefore, a special configuration for applying a high voltage is unnecessary, facilitating making the device more compact.

Preferably, the capacitance Ca of the piezoelectric actuator element, resistance R1 of the first resistor circuit, capacitance C1 of the capacitor circuit, and resistance R2 of the second resistor circuit should be set so that the following conditional expression (1) is satisfied.

$$Ca \cdot R1 < C1 \cdot R2 \qquad (1)$$

If this conditional expression (1) is satisfied, the abovementioned impedance ratio |Z1/Z2| will be larger in the transient state, which includes a frequency component, than in the steady state, which includes almost no frequency component.

The foregoing and other objects, features and advantages of the present invention will be apparent form the following detailed description of the preferred embodiments of the invention, reference being made to the accompanying drawings.

DESCRIPTION OF THE PREFERRED EMBODIMENTS

Figure 1:
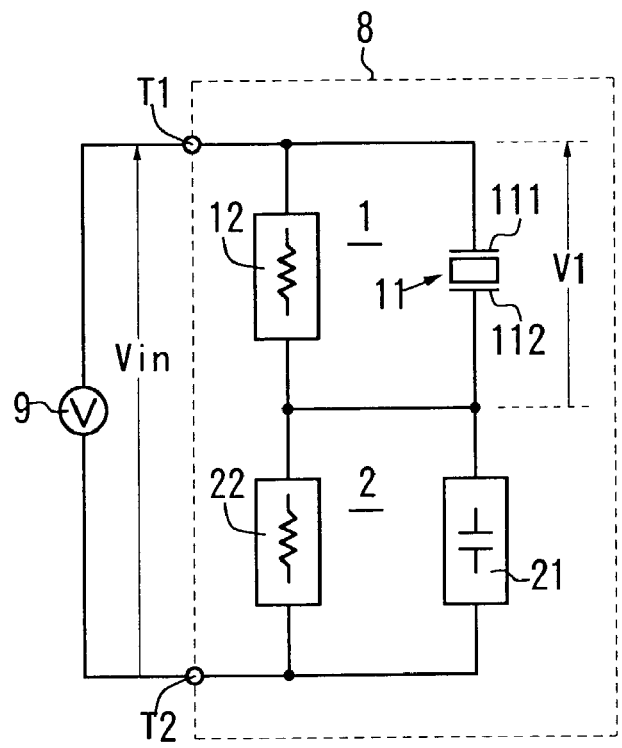
FIG. 1 is a circuit diagram showing the circuit configuration of a piezoelectric actuator device of the present invention.

Referring to FIG. 1, a piezoelectric actuator device 8 of the present invention comprises a first circuit 1 and a second circuit 2.

The first circuit 1 comprises a piezoelectric actuator element 11 and a first resistor circuit 12. The piezoelectric actuator element 11 and first resistor circuit 12 are connected in parallel. In the specification, the resistance (combined resistance) of the first resistor circuit 12 is represented by R1. The piezoelectric actuator element 11 may be a single-layer type piezoelectric actuator element or a laminated-type piezoelectric actuator element.

The second circuit 2 comprises a capacitor circuit 21 and a second resistor circuit 22. The capacitor circuit 21 and second resistor circuit 22 are connected in parallel. In the specification, the capacitance (combined capacitance) of the capacitor circuit 21 is represented by C1 and the resistance (combined resistance) of the second resistor circuit 22 is represented by R2.

The first circuit 1 and second circuit 2 are connected in series to form a series circuit, and both ends of that series circuit are led to a pair of input terminals T1 and T2. In the circuit configuration shown in the figure, one end of the parallel circuit due to the piezoelectric actuator element 11 and first resistor circuit 12 is connected with one end of the parallel circuit due to the capacitor circuit 21 and second resistor circuit 22. In addition, the other end of the parallel circuit due to the piezoelectric actuator element 11 and first resistor circuit 12 is connected with one input terminal T1, and the other end of the parallel circuit due to the capacitor circuit 21 and second resistor circuit 22 is connected with the other input terminal T2.

A power supply 9 is connected to the input terminals T1 and T2. The power supply 9 applies an input DC voltage Vin between the input terminals T1 and T2. The polarity of the input DC voltage Vin is oriented to make the electric potential of the input terminal T1 to the input terminal T2 higher. For example, a variable DC voltage source is used as the power supply 9.

Figure 2:
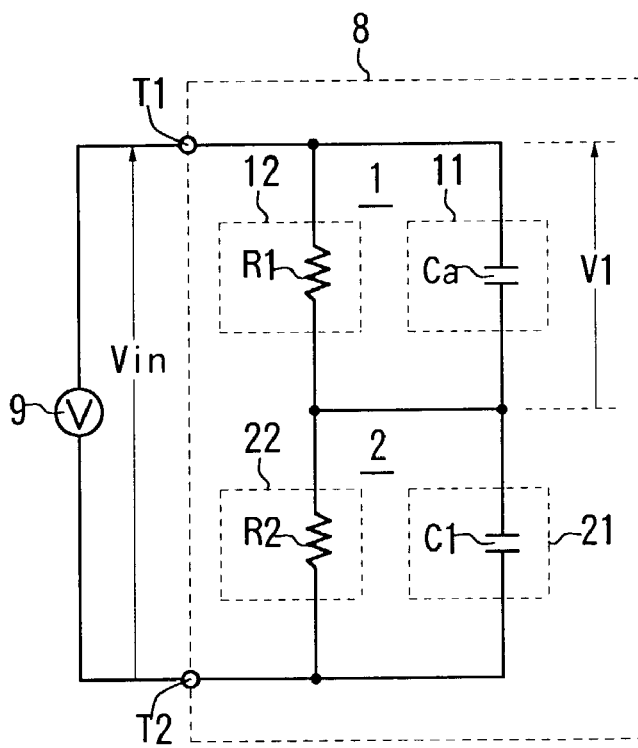
FIG. 2 is an equivalent circuit diagram of the circuit configuration shown in FIG. 1.

FIG. 2 is an equivalent circuit diagram of the circuit configuration shown in FIG. 1. When viewed using the equivalent circuit, the piezoelectric actuator element 11 is represented by a capacitor Ca. The capacitance of the capacitor Ca, that is, the capacitance of the piezoelectric actuator element 11 is also represented by the same Ca below.

In the embodiment, the first resistor circuit 12 is formed by only one resistor element R1, the second resistor circuit 22 is also formed by only one resistor element R2, and the capacitor circuit 21 is similarly formed by only one capacitor C1.

Unlike the embodiment, the first resistor circuit or second resistor circuit may be formed by using a plurality of resistor elements. For example, they may be formed by connecting a plurality of resistor elements in series or in parallel. Similarly, the capacitor circuit may also be formed by using a plurality of capacitors. For example, it may be formed by connecting a plurality of capacitors in series or in parallel.

The capacitance Ca of the piezoelectric actuator element 11, resistance R1 of the first resistor circuit 12, capacitance C1 of the capacitor circuit 21, and resistance R2 of the second resistor circuit 22 are set to appropriate values. Preferably, the capacitance Ca, resistance R1, capacitance C1, and resistance R2 are set so that the abovementioned conditional expression (1) is satisfied.

$$Ca \cdot R1 < C1 \cdot R2 \qquad (1)$$

However, in applying this conditional expression (1), make sure that the units of the capacitances Ca and C1 are same and that the units of resistances R1 and R2 are same. A specific example satisfying the conditional expression (1) is shown below.

EXAMPLE 1

Ca=16 $\mu$F

R1=510 k$\Omega$

C1=220 $\mu$F

R2=180 k$\Omega$

The abovementioned example 1 can be obtained by measuring the capacitance Ca of the piezoelectric actuator element 11 and setting the resistance R1 of the first resistor circuit 12, capacitance C1 of the capacitor circuit 21, and resistance R2 of the second resistor circuit 22 so that the conditional expression (1) is satisfied for the measured capacitance Ca.

As explained with reference to FIG. 1 and FIG. 2, since the first circuit 1 comprises the piezoelectric actuator element 11 and first resistance circuit 12, which are connected in parallel, an impedance Z1 is generated according to the capacitance Ca of the piezoelectric actuator element 11 and resistance R1 of the first resistor circuit 12. Specifically, the impedance Z1 is given by the following equation (2) from the capacitance Ca and resistance R1.

$$Z1 = \frac{R1}{1 + j\omega Ca \cdot R1} \qquad (2)$$

In the above expression (2), $\omega$ is angular frequency. When the frequency is represented by f, the angular frequency $\omega$ is given by $2\pi \cdot f$.

In addition, the magnitude |Z1| of the impedance Z1 is given by the following equation (3) from the abovementioned equation (2).

$$|Z1| = \frac{R1}{\sqrt{1+(\omega Ca \cdot R1)^2}} \quad (3)$$

Like the abovementioned first circuit 1, since the second circuit 2 comprises the capacitor circuit 21 and second resistance circuit 22, which are connected in parallel, an impedance Z2 is generated according to the capacitance C1 of the capacitor circuit 21 and resistance R2 of the second resistor circuit 22. Specifically, the impedance Z2 is given by the following equation (4) from the capacitance C1 and resistance R2.

$$Z2 = \frac{R2}{1+j\omega C1 \cdot R2} \quad (4)$$

In addition, the magnitude |Z2| of the impedance Z2 is given by the following equation (5) from the abovementioned equation (4).

$$|Z2| = \frac{R2}{\sqrt{1+(\omega C1 \cdot R2)^2}} \quad (5)$$

The first and second circuits 1 and 2 are connected in series to form a series circuit, and both ends of that series circuit are led to a pair of the input terminals T1 and T2. Therefore, if the input DC voltage Vin is applied between the input terminals T1 and T2 by the power supply 9, the input DC voltage Vin is divided according to the impedance ratio |Z1/Z2| of the first circuit 1 to the second circuit 2. Specifically, the impedance ratio |Z1/Z2| is given by the following equation (6) from the abovementioned equations (3) and (5).

$$\left|\frac{Z1}{Z2}\right| = \frac{R1 \cdot \sqrt{1+(\omega C1 \cdot R2)^2}}{R2 \cdot \sqrt{1+(\omega Ca \cdot R1)^2}} \quad (6)$$

Since the input DC voltage Vin is divided in this way, a voltage V1 that depends on the input DC voltage Vin is applied to the piezoelectric actuator element 11 included in the first circuit 1. Therefore, by changing the input DC voltage Vin between the input terminals T1 and T2, the voltage V1, which is applied to the piezoelectric actuator element 11, can be changed to control the amount of displacement of the piezoelectric actuator element 11. In the embodiment shown in the figure, the same voltage V1 is applied to the first circuit 1, and the piezoelectric actuator element 11 included therein.

When the input DC voltage Vin between the input terminals T1 and T2 is changed as described above, the voltage V1, which is applied to the piezoelectric actuator element 11, changes from a steady state, and a transient state occurs until that voltage V1 is stabilized.

In the present invention, the capacitance Ca of the piezoelectric actuator element 11 and resistance R1 of the first resistor circuit 12, which are included in the first circuit 1, capacitance C1 of the capacitor circuit 21 and resistance R2 of the second resistor circuit 22, which are included in the second circuit 2, should be set to appropriate values. For example, they should be set so that the abovementioned conditional expression (1) is satisfied.

$$Ca \cdot R1 < C1 \cdot R2 \quad (1)$$

If this is done, they will be set so that the abovementioned impedance ratio |Z1/Z2| will be larger in the transient state, which includes a frequency component, than in the steady state, which includes almost no frequency component. For example, for the abovementioned example 1, which satisfies the conditional expression (1), if the numerical values of the example 1 are assigned in the abovementioned equation (6), the value $\alpha$ for the impedance ratio |Z1/Z2| in the steady state, which includes almost no frequency component (frequency f=0 Hz), is approximately 3, and the value $\beta$ in the transient state, which includes a frequency component (frequency f≧1 Hz), is approximately 13. Therefore, the transient-state value $\beta$ for the impedance ratio |Z1/Z2| is at least four times greater than the steady-state value $\alpha$.

Therefore, when the input DC voltage Vin is changed while controlling the amount of displacement of the piezoelectric actuator element 11, a larger voltage than the steady-state applied voltage is temporarily applied to the first circuit 1, and so a voltage that exceeds the required voltage is temporarily applied to the piezoelectric actuator element 11. As a result, the hysteresis in the amount of displacement of the piezoelectric actuator element 11 is reduced.

Figure 3:
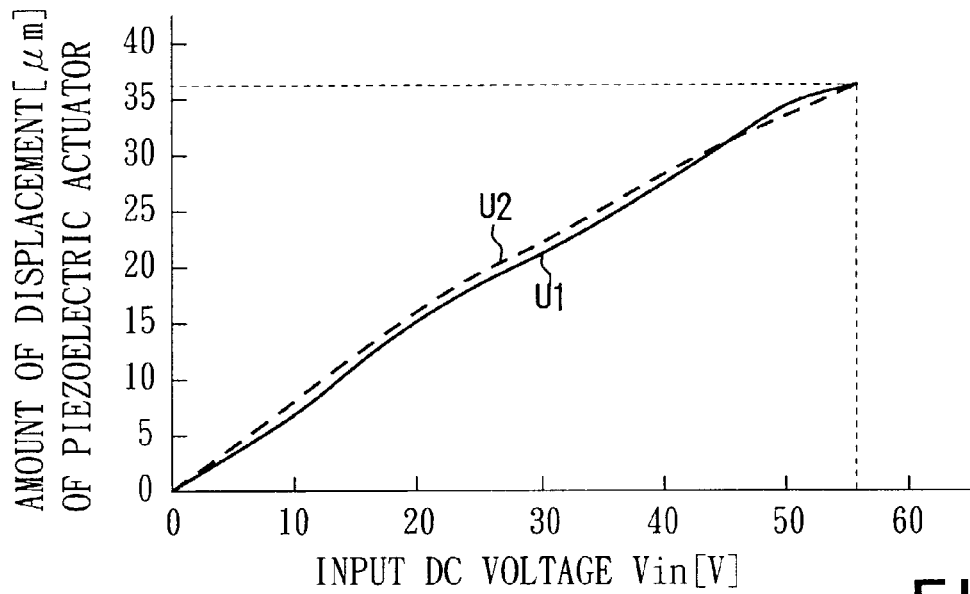
FIG. 3 is experiment data showing the relationship between the input DC voltage and the amount of displacement of the piezoelectric actuator element.

FIG. 3 is experiment data showing the relationship between the input DC voltage and the amount of displacement of the piezoelectric actuator element. This experiment data is according to the abovementioned example 1, where the horizontal axis shows the input DC voltage Vin [V] between the input terminals T1 and T2, and the vertical axis shows the amount of displacement [$\mu$m] of the piezoelectric actuator element 11. In FIG. 3, the property U1 indicated by the solid line is the property for the process in which the input DC voltage Vin is increased from 0V to 60V (voltage-increase process), and the property U2 indicated by the dashed line is the property for the process in which the input DC voltage Vin is decreased from 60V to 0V (voltage-decrease process). Referring to FIG. 3, it is clear that the difference between the property U1 for the voltage-increase process and property U2 for the voltage-decrease process is insignificant, and the hysteresis of the amount of displacement for the input DC voltage Vin is extremely small.

Also, according to the present invention, the amount of displacement of the piezoelectric actuator element 11 can be controlled without establishing a feedback control circuit, and so the system configuration is simplified.

Moreover, according to the present invention, the amount of displacement of the piezoelectric actuator element 11 can be controlled without applying a high voltage. Therefore, a special configuration for applying a high voltage is unnecessary, facilitating making the device more compact.

Preferably, the impedances Z1 and Z2 of the first and second circuits 1 and 2 are set so that their magnitudes |Z1| and |Z2| satisfy the following conditional expression (7).

$$|Z1| > |Z2| \quad (7)$$

For example, for the previous example 1, the impedance ratio |Z1/Z2| satisfies the abovementioned conditional expression (7) since the value $\alpha$ in the steady state, which includes almost no frequency component (frequency f=0 Hz), is approximately 3 and the value $\beta$ in the transient state, which includes a frequency component (frequency f≧1 Hz), is approximately 13.

If the impedances Z1 and Z2 of the first and second circuits 1 and 2 are set so that conditional expression (7) is satisfied, a sufficient voltage V1 is applied to the piezoelectric actuator element 11 of the first circuit 1. This enables the amount of displacement of the piezoelectric actuator element 11 to be satisfactorily controlled.

Referring to FIG. 1, one electrode 111 of the piezoelectric actuator element 11 is led to one input terminal T1 and the other electrode 112 is led to the other input terminal T2 via the second circuit 2. As described above, the input DC voltage Vin is applied between the input terminals T1 and T2, and the polarity of the input DC voltage Vin is oriented to make the electric potential of the input terminal T1 to the input terminal T2 higher. Therefore, the polarity of the voltage V1, which is applied to the piezoelectric actuator element 11, is oriented to make the electric potential of the electrode 111 to the electrode 112 higher.

Figure 4:
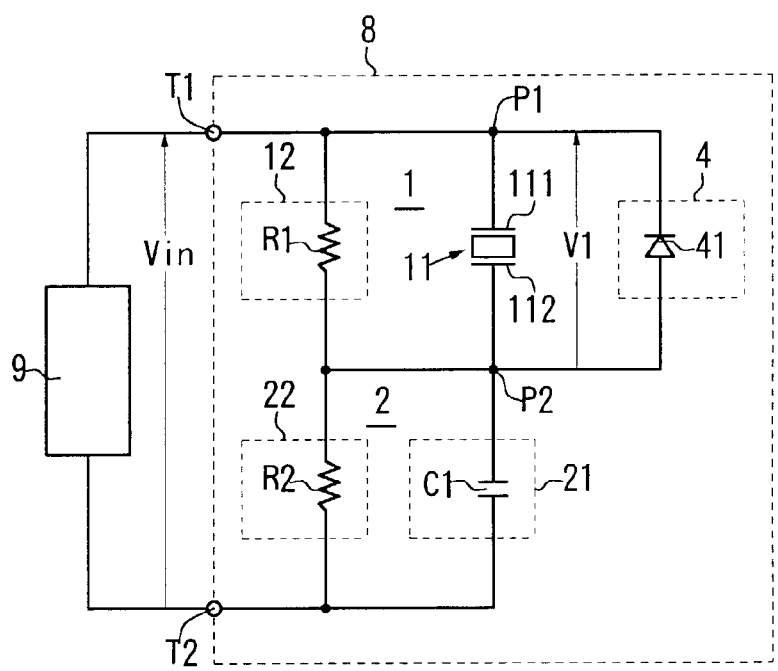
FIG. 4 is a circuit diagram showing the circuit configuration in another embodiment of a piezoelectric actuator device of the present invention.

FIG. 4 is a circuit diagram showing the circuit configuration in another embodiment of a piezoelectric actuator device of the present invention. In this figure, the same reference numbers have been assigned for the same components as the ones shown in FIG. 1 and FIG. 2, and explanations of these components are omitted.

The special feature of this embodiment is that a rectifying circuit 4 is provided. The rectifying circuit 4 is connected in parallel to the piezoelectric actuator element 11. Specifically, one end of the rectifying circuit 4 is connected to one electrode 111 of the piezoelectric actuator element 11 to form one connection point P1, and the other end of the rectifying circuit 4 is connected to the other electrode 112 of the piezoelectric actuator element 11 to form another connection point P2. Viewing the circuit according to these connection points P1 and P2, the polarity of the voltage V1, which is applied to the piezoelectric actuator element 11, appears to be oriented to make the electric potential of the connection point P1 to the connection point P2 higher.

In addition, the rectifying circuit 4 is oriented in the opposite direction with respect to the polarity of the voltage V1, which is applied to the piezoelectric actuator element 11. Specifically, the rectifying circuit 4 is oriented in such direction as to cause the current to flow from the connection point P2 to the connection point P1 through the rectifying circuit 4.

In the embodiment shown in the figure, the rectifying circuit 4 is formed by only one rectifying element 41, and the rectifying element 41 is oriented in the opposite direction with respect to the polarity of the voltage V1, which is applied to the piezoelectric actuator element 11. The rectifying element 41 is a diode, for example. Unlike the embodiment shown in the figure, the rectifying circuit may be formed by using a plurality of rectifying elements. For example, it may be formed by connecting a plurality of rectifying elements in series or in parallel.

If a large reverse voltage is applied to the piezoelectric actuator element, there is a risk of polarization annihilation or property degradation. In particular, for a laminated-type piezoelectric actuator element, since the element thickness per sheet is small, the risk of polarization annihilation or property degradation is great.

In the present embodiment, the rectifying circuit 4 is connected in parallel to the piezoelectric actuator element 11 and is oriented in the opposite direction with respect to the polarity of the voltage V1, which is applied to the piezoelectric actuator element 11. Therefore, the rectifying circuit 4 protects the piezoelectric actuator element 11 so that a large reverse voltage is not applied thereto. Consequently, polarization annihilation or property degradation of the piezoelectric actuator element 11 is prevented.

As described above, the following results can be obtained according to the present invention.
(a) A piezoelectric actuator device that enables hysteresis of the amount of displacement in the piezoelectric actuator to be reduced can be provided.
(b) A piezoelectric actuator device that enables the system configuration to be simplified can be provided.
(c) A piezoelectric actuator device for which a high voltage need not be applied can be provided.

While the present invention has been particularly shown and described with reference to preferred embodiments thereof, it will be understood by those skilled in the art that various changes in form and detail may be made therein without departing from the sprit, scope and teaching of the invention. Accordingly, the invention herein disclosed is to be considered merely as illustrative and limited in scope only as specified in the appended claims.

What is claimed is:

1. A piezoelectric actuator device comprising a first circuit and a second circuit, wherein;
    said first circuit comprises a piezoelectric actuator element and a first resistor circuit, said piezoelectric actuator element and said first resistor circuit being connected in parallel;
    said second circuit comprises a capacitor circuit and a second resistor circuit, said capacitor circuit and said second resistor circuit being connected in parallel; and
    said first circuit and said second circuit are connected in series to form a series circuit, both ends of that series circuit being led to a pair of input terminals, wherein said piezoelectric actuator element comprises a mechanical output device configured to drive a component.

2. A piezoelectric actuator device comprising a first circuit and a second circuit, wherein:
    said first circuit comprises a piezoelectric actuator element and a first resistor circuit, said piezoelectric actuator element and said first resistor circuit being connected in parallel;
    said second circuit comprises a capacitor circuit and a second resistor circuit, said capacitor circuit and said second resistor circuit being connected in parallel;
    said first circuit and said second circuit are connected in series to form a series circuit, both ends of that series circuit being led to a pair of input terminals; and
    when the capacitance of said piezoelectric actuator element is represented by Ca, the resistance of said first resistor circuit is represented by R1, the capacitance of said capacitor circuit is represented by C1, and the resistance of said second resistor circuit is represented by R2,
    said piezoelectric actuator device satisfies the following conditional expression:

$$Ca \cdot R1 < C1 \cdot R2.$$

3. The piezoelectric actuator device according to claim 1, wherein;
    said piezoelectric actuator device further comprises a rectifying circuit; and
    said rectifying circuit is connected in parallel to said piezoelectric actuator element and is oriented in the opposite direction with respect to the polarity of the voltage to be applied to said piezoelectric actuator element.

4. The piezoelectric actuator device according to claim 2, wherein;

said piezoelectric actuator device further comprises a rectifying circuit; and said rectifying circuit is connected in parallel to said piezoelectric actuator element and is oriented in the opposite direction with respect to the polarity of the voltage to be applied to said piezoelectric actuator element.

5. A piezoelectric actuator circuit comprising a first circuit and a second circuit, wherein;

said first circuit comprises a piezoelectric actuator element and a first resistor circuit, said piezoelectric actuator element and said first resistor circuit being connected in parallel;

said second circuit comprises a capacitor circuit and a second resistor circuit, said capacitor circuit and said second resistor circuit being connected in parallel; and said first circuit and said second circuit are connected in series to form a series circuit, both ends of that series circuit being led to a pair of input terminals, wherein said piezoelectric actuator element comprises a mechanical output device configured to drive a component.

6. A piezoelectric actuator circuit comprising a first circuit and a second circuit, wherein:

said first circuit comprises a piezoelectric actuator element and a first resistor circuit, said piezoelectric actuator element and said first resistor circuit being connected in parallel;

said second circuit comprises a capacitor circuit and a second resistor circuit, said capacitor circuit and said second resistor circuit being connected in parallel;

said first circuit and said second circuit are connected in series to form a series circuit, both ends of that series circuit being led to a pair of input terminals; and when the capacitance of said piezoelectric actuator element is represented by Ca, the resistance of said first resistor circuit is represented by R1, the capacitance of said capacitor circuit is represented by C1, and the resistance of said second resistor circuit is represented by R2, said piezoelectric actuator circuit satisfies the following conditional expression:

$Ca \cdot R1 < C1 \cdot R2$.

7. The piezoelectric actuator circuit according to claim 5, wherein;

said piezoelectric actuator circuit further comprises a rectifying circuit; and said rectifying circuit is connected in parallel to said piezoelectric actuator element and is oriented in the opposite direction with respect to the polarity of the voltage to be applied to said piezoelectric actuator element.

8. The piezoelectric actuator circuit according to claim 6, wherein;

said piezoelectric actuator circuit further comprises a rectifying circuit; and said rectifying circuit is connected in parallel to said piezoelectric actuator element and is oriented in the opposite direction with respect to the polarity of the voltage to be applied to said piezoelectric actuator element.

9. A piezoelectric actuator device comprising a first circuit and a second circuit, wherein:

said first circuit comprises a piezoelectric actuator element and a first resistor circuit, said piezoelectric actuator element and said first resistor circuit being connected in parallel;

said second circuit comprises a capacitor circuit and a second resistor circuit, said capacitor circuit and said second resistor circuit being connected in parallel;

said first circuit and said second circuit are connected in series to form a series circuit, both ends of that series circuit being led to a pair of input terminals; and the impedance of the first circuit and the impedance of the second circuit satisfies the expression:

$|Z1| > |Z2|$.

10. A piezoelectric actuator circuit comprising a first circuit and a second circuit, wherein:

said first circuit comprises a piezoelectric actuator element and a first resistor circuit, said piezoelectric actuator element and said first resistor circuit being connected in parallel;

said second circuit comprises a capacitor circuit and a second resistor circuit, said capacitor circuit and said second resistor circuit being connected in parallel; and said first circuit and said second circuit are connected in series to form a series circuit, both ends of that series circuit being led to a pair of input terminals; and the impedance of the first circuit and the impedance of the second circuit satisfies the expression:

$|Z1| > |Z2|$.

11. A piezoelectric actuator device comprising a first circuit and a second circuit, wherein;

said first circuit comprises a first resistor circuit and a piezoelectric actuator element for converting an input voltage into an output mechanical displacement, said piezoelectric actuator element and said first resistor circuit being connected in parallel;

said second circuit comprises a capacitor circuit and a second resistor circuit, said capacitor circuit and said second resistor circuit being connected in parallel;

said first circuit and said second circuit are connected in series to form a series circuit, both ends of that series circuit being led to a pair of input terminals; and said piezoelectric actuator element comprises a mechanical output device configured to drive a component.

12. A piezoelectric actuator device comprising a first circuit and a second circuit, wherein:

said first circuit comprises a first resistor circuit and a piezoelectric actuator element for converting an input voltage into an output mechanical displacement, said piezoelectric actuator element and said first resistor circuit being connected in parallel;

said second circuit comprises a capacitor circuit and a second resistor circuit, said capacitor circuit and said second resistor circuit being connected in parallel;

said first circuit and said second circuit are connected in series to form a series circuit, both ends of that series circuit being led to a pair of input terminals; and when the capacitance of said piezoelectric actuator element is represented by Ca, the resistance of said first resistor circuit is represented by R1, the capacitance of said capacitor circuit is represented by C1, and the resistance of said second resistor circuit is represented by R2, said piezoelectric actuator device satisfies the following conditional expression:

$Ca \cdot R1 < C1 \cdot R2$.

13. A piezoelectric actuator circuit comprising a first circuit and a second circuit, wherein;

said first circuit comprises a first resistor circuit and a piezoelectric actuator element for converting an input voltage into an output mechanical displacement, said piezoelectric actuator element and said first resistor circuit being connected in parallel;

said second circuit comprises a capacitor circuit and a second resistor circuit, said capacitor circuit and said second resistor circuit being connected in parallel;

said first circuit and said second circuit are connected in series to form a series circuit, both ends of that series circuit being led to a pair of input terminals; and said piezoelectric actuator element comprises a mechanical output device configured to drive a component.

14. A piezoelectric actuator circuit comprising a first circuit and a second circuit, wherein;

said first circuit comprises a first resistor circuit and a piezoelectric actuator element for converting an input voltage into an output mechanical displacement, said piezoelectric actuator element and said first resistor circuit being connected in parallel;

said second circuit comprises a capacitor circuit and a second resistor circuit, said capacitor circuit and said second resistor circuit being connected in parallel;

said first circuit and said second circuit are connected in series to form a series circuit, both ends of that series circuit being led to a pair of input terminals; and when the capacitance of said piezoelectric actuator element is represented by Ca, the resistance of said first resistor circuit is represented by R1, the capacitance of said capacitor circuit is represented by C1, and the resistance of said second resistor circuit is represented by R2, said piezoelectric actuator circuit satisfies the following conditional expression:

$Ca \cdot R1 < C1 \cdot R2.$

* * * * *